(12) United States Patent
Berlureau (10) Patent No.: US 6,479,967 B2
(45) Date of Patent: Nov. 12, 2002

(54) METHOD OF CONTROLLING THE DISCHARGING OF A SECONDARY STORAGE CELL BATTERY

(75) Inventor: Thierry Berlureau, Bordeaux (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/090,751

(22) Filed: Mar. 6, 2002

(65) Prior Publication Data

US 2002/0130635 A1 Sep. 19, 2002

(30) Foreign Application Priority Data

Mar. 19, 2001 (FR) .............................. 01 03679

(51) Int. Cl.$^7$ ................................ H02J 7/00
(52) U.S. Cl. ........................ 320/136; 320/135
(58) Field of Search ........................ 320/136, 157, 320/135, 132, 131, 130, 128, 127, 124

(56) References Cited

U.S. PATENT DOCUMENTS 5,631,540 A * 5/1997 Nguyen ................... 320/127
5,936,383 A    8/1999 Ng et al. ................. 320/132

* cited by examiner

Primary Examiner—Edward H. Tso
Assistant Examiner—Lawrence Luk
(74) Attorney, Agent, or Firm—Sughrue Mion, PLLC (57) ABSTRACT

A method of controlling the discharging of a battery including a plurality of modules each consisting of at least one secondary storage cell includes the following steps:

(a) a voltage $Vz(t_n)$ of each module z and a discharge current $I(t_n)$ are measured synchronously at time $t_n$, (b) the internal resistance $IRz(t_n)$ of each module z is calculated as follows: $IRz(t_n)=Vz(t_n)/I(t_n)$, (c) a voltage $Vz(t_{n+1})$ of each module z and a discharge current $I(t_{n+1})$ are measured synchronously at time $t_{n+1}$, (d) the internal resistance $IRz(t_{n+1})$ of each module z is calculated as follows: $IRz(t_{n+1})=Vz(t_{n+1})/I(t_{n+1})$, (e) the slope of the variation in the internal resistance $IRSz$ of each module z is calculated between times $t_n$ and $t_{n+1}$ as follows: $IRSz=[IRz(t_{n+1})-IRz(t)]/I(t_n)$,

(f) the maximum value $IRS^{max}$ and the average value $IRS^{avg}$ of the slopes of the variation in the internal resistance of all the modules are calculated, (g) a difference DIRS is calculated as follows: $DIRS=IRS^{max}-IRS^{avg}$,

(h) the difference DIRS is compared to a criterion K determined experimentally, and (i) the first phase of discharging is stopped when DIRS is greater than or equal to K, following correction of the rate of change dI/dt of the discharging current I(t).

5 Claims, 9 Drawing Sheets

METHOD OF CONTROLLING THE DISCHARGING OF A SECONDARY STORAGE CELL BATTERY

CROSS-REFERENCE TO RELATED APPLICATIONS

This application is based on French Patent Application No. 01 03 679 filed Mar. 19, 2001, the disclosure of which is hereby incorporated by reference thereto in its entirety, and the priority of which is hereby claimed under 35 U.S.C. §119.

BACKGROUND OF THE INVENTION

1. Field of the Invention

The present invention relates to a method of controlling the discharging of a battery including at least two secondary storage cells, and in particular to a method of detecting the end of discharging. The method is more particularly intended to be applied to an alkaline electrolyte secondary storage cell battery, especially a nickel/metal hydride battery.

2. Description of the Prior Art

The term "industrial" applies to a storage cell which has a high capacity, meaning a capacity greater than 10 Ah, and generally from 50 Ah to 200 Ah. Industrial storage cells usually have a prism-shaped plastics material container containing plane electrodes. Their parallelepipedal geometry and the nature of their tank means that they cannot resist high pressures, and their maximum internal pressure is of the order of 1 bar to 2 bar. "Maintenance free" industrial storage cells and "sealed" industrial storage cells have the advantage that they do not necessitate topping up of the level of the aqueous electrolyte at any time during their use, unlike "standard unsealed" industrial storage cells or "reduced maintenance unsealed" industrial storage cells.

Batteries of such storage cells are used in the aeronautical, rail, road and stationary fields. They are intended, among other things, for electric vehicle traction. In this application, the required service life is approximately 1 500 charge/discharge cycles over an estimated period of 10 years. A service life of this length can be achieved only if premature deterioration of the storage cells is avoided. In particular, discharging must be strictly controlled to avoid any inversion or overdischarging of any of the cells.

For standard nickel-cadmium unsealed industrial storage cell batteries, overdischarging has little influence on the service life of the storage cells because the consumption of water is periodically compensated by topping up as a maintenance operation. The end of discharging is managed by way of the total voltage of the battery. Discharging is stopped when the battery voltage reaches a particular value.

There is a decrease in power towards the end of discharging. To make this reduction in power more gradual, the storage cells are grouped together (in groups of 5 to 10 storage cells, for example) and the voltages of the groups are compared with each other: the greater the difference, the nearer the end of discharging. Discharging is stopped when the voltage difference $\Delta V$ between the voltages of two of the groups of storage cells reaches a prescribed value.

An improvement to this latter method consists in weighting the voltage difference $\Delta V$ by the average value $V^{avg}$ of the groups of storage cells to obtain a weighted value $\Delta V/V$ which is compared to a specified criterion.

Maintenance-free and sealed industrial storage cells, in particular nickel/metal hydride cells, are more fragile with regard to overdischarging, among other things because of the generation of gas, the limited quantity of electrolyte and deterioration of the active materials as a result of inversion. If the same method is applied, it is necessary to compare the voltage of modules formed from grouped storage cells, but discharging must be stopped when the difference between the voltages of the modules reaches a sufficiently low threshold to prevent overdischarging. It may nevertheless happen that the threshold value is reached even though the battery is not yet at the end of discharging. This phenomenon can be due to the variation of the internal resistance between the storage cells (differential aging, replacement of a storage cell, etc.), the variation in the temperature inside the battery, or variation in the state of charge between the modules.

An object of the present invention is to propose a method of controlling the first phase of discharging a storage cell battery when there is a variation in internal resistance between the storage cells.

SUMMARY OF THE INVENTION

The present invention provides a method of controlling the discharging of a battery including a plurality of modules each consisting of at least one secondary storage cell, which method includes the following steps:

(a) a voltage $V(t_n)$ of each module and a discharge current $I(t_n)$ are measured synchronously at time $t_n$, (b) the internal resistance $IR(t_n)$ of each module is calculated as follows: $IR(t_n)=V(t_n)/I(t_n)$, (c) a voltage $V(t_{n+1})$ of each module and a discharge current $I(t_{n+1})$ are measured synchronously at time $t_{n+1}$, (d) the internal resistance $IR(t_{n+1})$ of each module is calculated as follows: $IR(t_{n+1})=V(t_{n+1})/I(t_{n+1})$, (e) the slope of the variation in the internal resistance IRS of each module is calculated between times $t_n$ and $t_{n+1}$ as follows: $IRS=[IR(t_{n+1})-IR(t)]/I(t_n)$, (f) the maximum value $IRS^{max}$ and the average value $IRS^{avg}$ of the slopes of the variation in the internal resistance of all the modules are calculated, (g) a difference DIRS is calculated as follows: $DIRS=IRS^{max}-IRS^{avg}$, (h) the difference DIRS is compared to a criterion K determined experimentally, and (i) the first phase of discharging is stopped when DIRS is greater than or equal to K, following correction of the rate of change dI/dt of the discharging current I(t).

It is seen that the end of the first phase of discharging of the battery is determined by the module having the greatest internal resistance slope.

The method according to the invention makes the end of discharging more progressive by introducing a second phase of discharging and prevents the inversion of a module at the end of discharging in spite of the variation in internal resistance between the modules.

In the particular case in which the battery is made up of two modules each consisting of at least one secondary storage cell, the method includes the following steps:

(a) a voltage $V_1(tn)$ for the module 1, a voltage $V_2(t_n)$ for the module 2, and a discharge current $I(t_n)$ are measured synchronously at time $t_n$, (b) internal resistances $IR_1(t_n)$ and $IR_2(t_n)$ are calculated as follows: $IR_1(t_n)=V_1(t_n)/I(t_n)$ and $IR_2(t_n)=V_2(t_n)/I(t_n)$, (c) a voltage $V_1(t_{n+1})$ for the module 1, a voltage $V_2(t_{n+1})$ for the module 2, and a discharge current $I(t_{n+1})$ are measured synchronously at time $t_{n+1}$, (d) internal resistances $IR_1(t_{n+1})$ and $IR_2(t_{n+1})$ are calculated as follows: $IR_1(t_{n+1})=V_1i(t_{n+1})/I(t_{n+1})$ and $IR_2(t_{n+1})=V_2(t_{n+1})/I(t_{n+1})$, (e) the slopes of the variation in the internal resistances $IRS_1$ and $IRS_2$ between times $t_n$ and $t_{n+1}$ are calculated as follows: $IRS_1=[IR_1(t_{n+1})-IR_1(t_n)]/(t_{n+1}-t_n)$ and $IRS_2=[IR_2(t_{n+1})-IR_2(t_n)]/(t_{n+1}-t_n)$, (f) a difference DIRS is calculated between the slopes of the internal resistances of the modules 1 and 2 as follows: $DIRS=IRS_1-IRS_2$, (g) the difference DIRS is compared to a criterion K determined experimentally, and (h) the first charging phase is stopped if DIRS is greater than or equal to K, after correcting the rate of charge dI/dt of the discharge current I(t).

This correction of the slope dI/dt of DIRS is rendered necessary by the dynamic aspect of electric vehicle operation, in which acceleration and deceleration phases in which the current is reversed alternate. Various laws can be envisaged for correcting the difference DIRS between the internal resistance slopes of the modules as a function of the slope dI/dt of the curve of the variation in time of the current I (t). In a preferred embodiment, DIRS is a linear function of the variation dI/dt of the discharge current I (t) in time.

The second phase of discharging can be either a complete halting of discharging or a progressive reduction of the discharging current I(t). The discharging current I(t) during the first phase of discharging is preferably at least equal to 100 A.

A further advantage of the present invention is that the method according to the invention generates intermediate alerts leading to a reduction of the discharging current in order to authorize a progressive end of discharging.

The following notation is used in the following description:

I (t): the value of the discharging current of the battery at time t, expressed in amperes;

Vi(t): the voltage of a module i of the battery at time t, expressed in volts;

$V^{avg}$: the average of the module voltages, expressed in volts;

$V^{min}$: the lowest module voltage, expressed in volts;

$\Delta V=V^{avg}-V^{min}$: the difference between the average value $V^{avg}$ and the lowest value $V^{min}$ of the module voltages, expressed in volts;

$\Delta V/V=(V^{avg}-V^{min})/V^{avg}$: the difference between the average value $V^{avg}$ and the lowest value $V^{min}$ of the module voltages, weighted by the average voltage $V^{avg}$ of the modules constituting the battery;

IRi(t): the internal resistance of a module i at time t, expressed in ohms;

IRSi: the slope of the variation in the internal resistance of the module i, expressed in ohms per second;

$IRS^{max}$: the highest internal resistance variation slope IRS of the modules constituting the battery, expressed in ohms per second;

$IRS^{avg}$: the average of the internal resistance variation slopes of all the modules constituting the battery, expressed in ohms per second;

DIRS: the difference between the maximum slope $IRS^{max}$ and the average slope $IRS^{avg}$ of the internal resistances of the modules constituting the battery, expressed in ohms per second, which depends on the variation in time of the discharging current; and K: the comparison value of the criterion DIRS for determining the end of the first discharging phase, which is a constant determined by experiment and expressed in ohms per second.

There follows a description of embodiments of the invention, given with reference to the accompanying drawings.

DETAILED DESCRIPTION OF THE PREFERRED EMBODIMENTS

It must be understood that these embodiments are provided entirely by way of illustration of the subject matter of the invention, on which they are not limiting in anyway.

EXAMPLE 1

A battery A was made up of 28 monoblock 12 V/93 Ah modules electrically connected in series, each consisting of 10 nickel/metal hydride storage cells electrically connected in series. The difference in internal resistance between the modules was less than 2.4 mΩ.

The number of storage cells constituting a module and the number of modules in the battery can of course be modified.

The battery A was subjected to the dynamic stress test (DST) specified in standard J1798 of the Society of Automotive Engineers (SAE), entitled "Recommended Practice for Performance Rating of Electric Vehicle Battery Modules". The whole of the DST algorithm was programmed on test bench systems from DIGATRON controlled by their BTS 600 system.

The DST conditions were as follows:
- discharging of 80% of the nominal capacity, i.e. 74.4 Ah per module, during which the cooling liquid circulated in the battery but there was no active cooling;
- charging at Ic/3 followed by overcharging at Ic/20 of 4.4 Ah to level the states of charge, where Ic was the current theoretically necessary to discharge the battery in one hour. The cooling was active at 12° C. during charging.

The test, which aims to be representative of real-world operation, was constructed from successions of charging and discharging periods alternating every six minutes, which produced the pulsation effect. The method in accordance with the invention is more particularly intended to be used under dynamic conditions in which the direction and the value of the current change frequently.

The end of charging was determined by a criterion related to the rate of change of temperature dT/dt, which was applied to the first module that reached it. The end of discharging was controlled by the ΔV criterion and the ΔV/V criterion of the prior art method and by the DIRS criterion of the method in accordance with the present invention.

ΔV Criterion

The voltage Vi (t) of each module i was measured at time t, with i=1 to 28 in this instance. An average voltage $V^{avg}$ was then calculated from these 28 values. The difference $\Delta V = V^{avg} - V^{min}$ was then calculated, where $V^{min}$ was the lowest of the voltages Vi measured for a module, and the discharging was stopped when ΔV=0.7 volt.

ΔV/V Criterion

As previously, the voltage Vi (t) of each module i (i=1 to 28) was measured at time t. An average voltage $V^{avg}$ was then calculated from these values. It was then possible to calculate the criterion $\Delta V/V = (V^{avg} - V^{min})/V^{avg}$, where $V^{min}$ was the lowest of the voltages Vi measured for a module i, and the discharging was stopped when ΔV/V=0.1.

At the start of discharging, the voltage Vi of each module was high ($V^{avg}$ was of the order of 12 V). The criterion ΔV/V=0.1 tolerated a voltage difference between the modules as high as 1.2 V, and thus a great difference in internal resistance between the modules.

This criterion offers greater tolerance with respect to the greater portion of the discharge. The object was to detect the possible inversion of a storage cell within a module at the end of discharging. The voltage of the modules was low at the end of discharging (for example Vi=8V for a module i of 10 storage cells). In this case, a voltage difference of 0.8 V corresponded to ΔV/V=0.1.

Method According to the Invention

Figure 1:
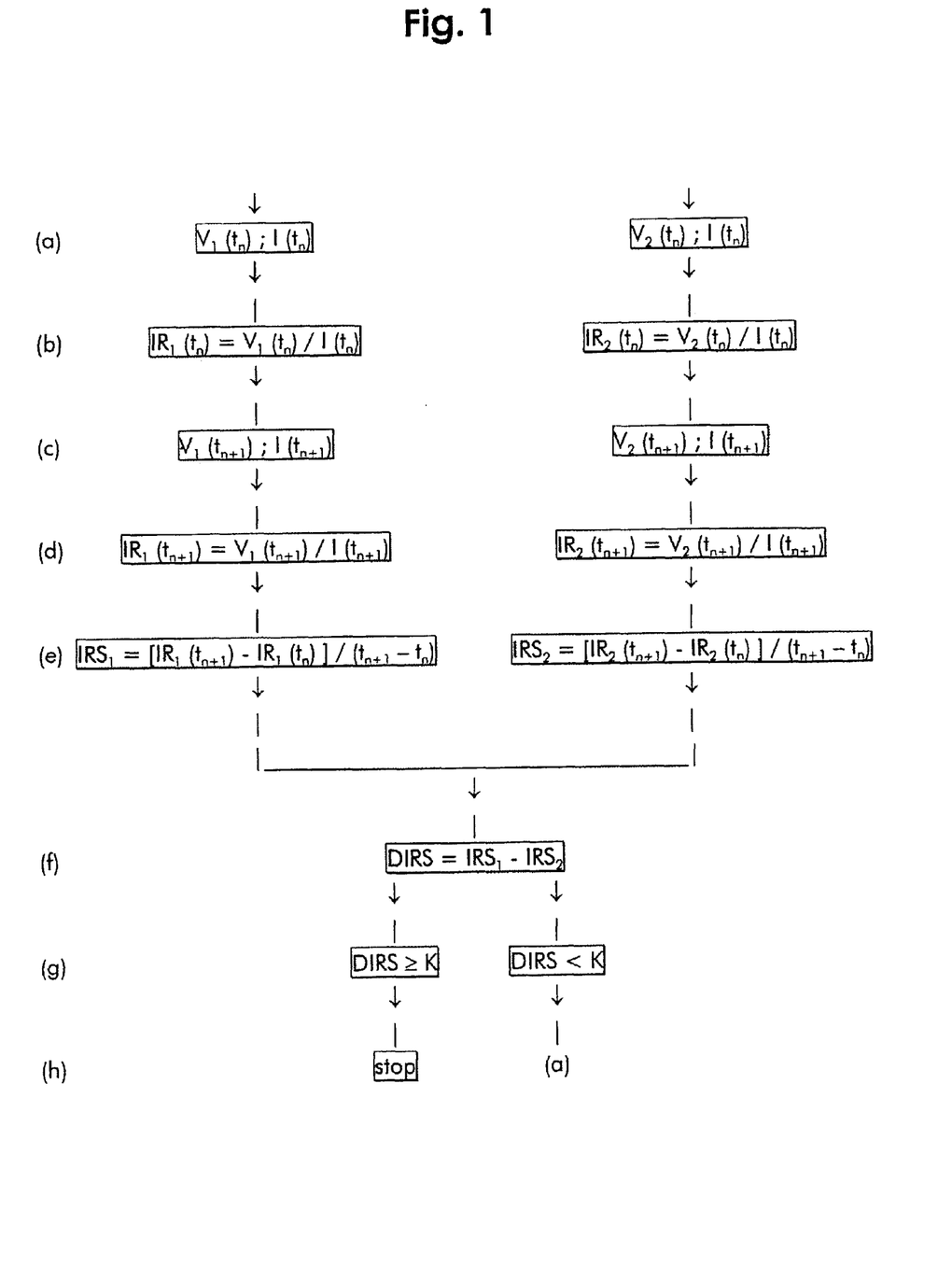
FIG. 1 shows diagrammatically the method according to the invention in the situation where the battery includes two modules 1 and 2.

FIG. 1 shows the method in accordance with the invention in the particular case where the battery includes two modules 1 and 2. The method applies equally well to a battery including a greater number of modules, of course.

Figure 3:
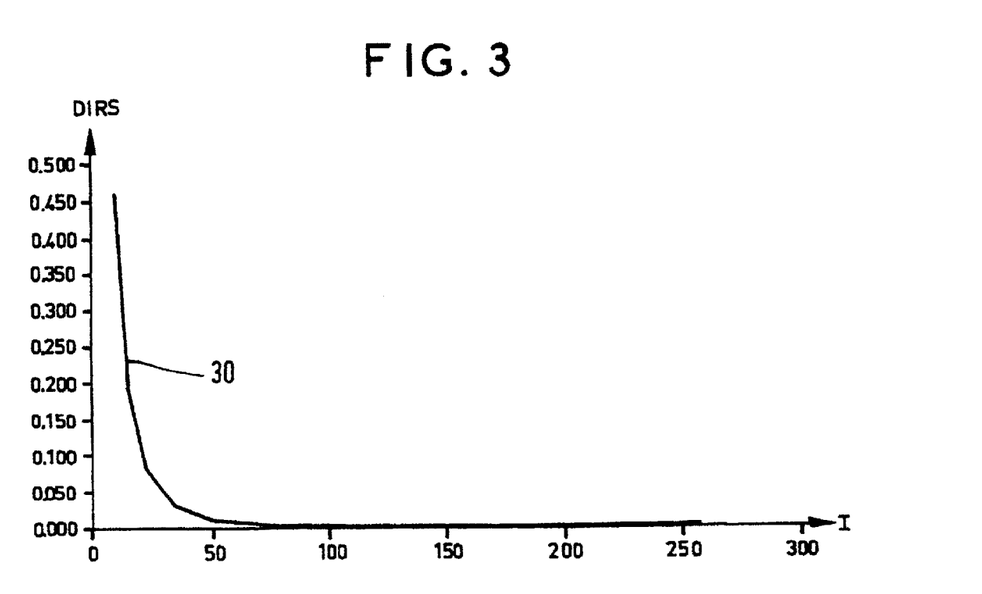
FIG. 3 shows the evolution of the difference DIRS between the internal resistance slopes of the modules, expressed in ohms per second, as a function of the current I, expressed in amperes.
Figure 4:
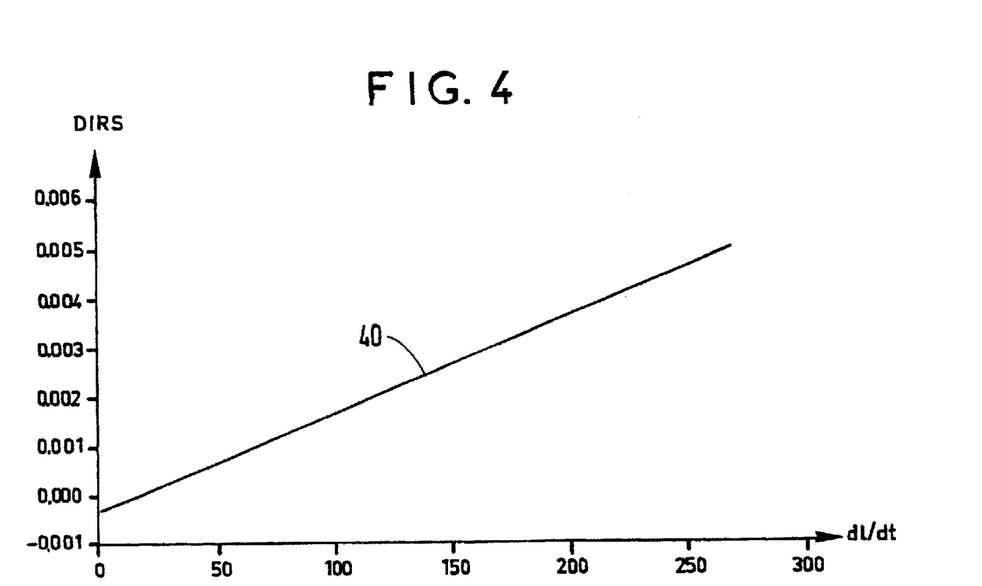
FIG. 4 shows the evolution of the difference DIRS between the internal resistance slopes of the modules, expressed in ohms per second, as a function of the rate of change dI/dt of the current, expressed in amperes per second.

The voltage $V_{i=1 \, to \, 28}(t)$ of each of the modules and the discharge current I(t) of the battery were measured periodically and synchronously (i.e. within a time interval less than 10 milliseconds). To facilitate application of the method in accordance with the invention, it is preferable for the discharge current to be at least 100 A, as shown by curve 30 in FIG. 3, which represents the evolution of the criterion DIRS as a function of the current I(t). The curve 40 in FIG. 4 shows that the criterion DIRS varied linearly with the rate of change of the discharge current dI/dt.

As shown in FIG. 1, during the first step (a), the voltage $V_1(t_n)$ of the module 1, the voltage $V_2(t_n)$ of the module 2, and the discharge current $I(t_n)$ of the battery were measured at time $t_n$. Then, in step (b), the internal resistances of the modules 1 and 2 were calculated, respectively $IR_1(t_n)=V_1(t_n)/I(t_n)$ and $IR_2(t_n)=V_2(t_n)/I(t_n)$.

At the next time $t_{n+1}$, the voltages $V_1(t_{n+1})$ and $V_2(t_{n+1})$ of the modules 1 and 2 and the discharge current $I(t_{n+1})$ of the module were measured in the same manner (step (c)). The internal resistances of the modules 1 and 2 were calculated, respectively $IR_1(t_{n+1})=V_1(t_{+1})/I(t_{n+1})$ and $IR_2(t_{n+1})=V_2(t_{n+1})/I(t_{n+1})$ in step (d).

The internal resistance slopes of the modules 1 and 2 were then calculated between times $t_n$ and $t_{n+1}$ in step (e), respectively $IRS_1=[IR_1(t_{n+1})-IR_1(t_n)]/(t_{n+1}-t_n)$ and $IRS_2(t_{n+1})-IR_2(t_n)]/(t_{n+1}-t_n)$.

Finally, in step (f), the difference DIRS between the internal resistance slopes of the modules 1 and 2 was calculated, $DIRS=IRS_1-IRS_2$. To decide if the discharging had to be stopped, or if the current had to be reduced to obtain a progressive end of discharging, in step (g) the slope difference DIRS was compared to a criterion K and the first phase of the discharging was stopped if the difference DIRS was greater than or equal to the criterion K.

The criterion K was a value in ohms/s determined experimentally. Before comparing it to K, the slope difference DIRS had to be corrected as a function of the rate of change dI/dt of the discharge current I(t) as shown by the curve 40 in FIG. 4 (acceleration or deceleration phase) to reduce it to a value corresponding to the conditions under which K was determined. The correction could equally well be applied to K instead of to DIRS, of course.

Figure 2:
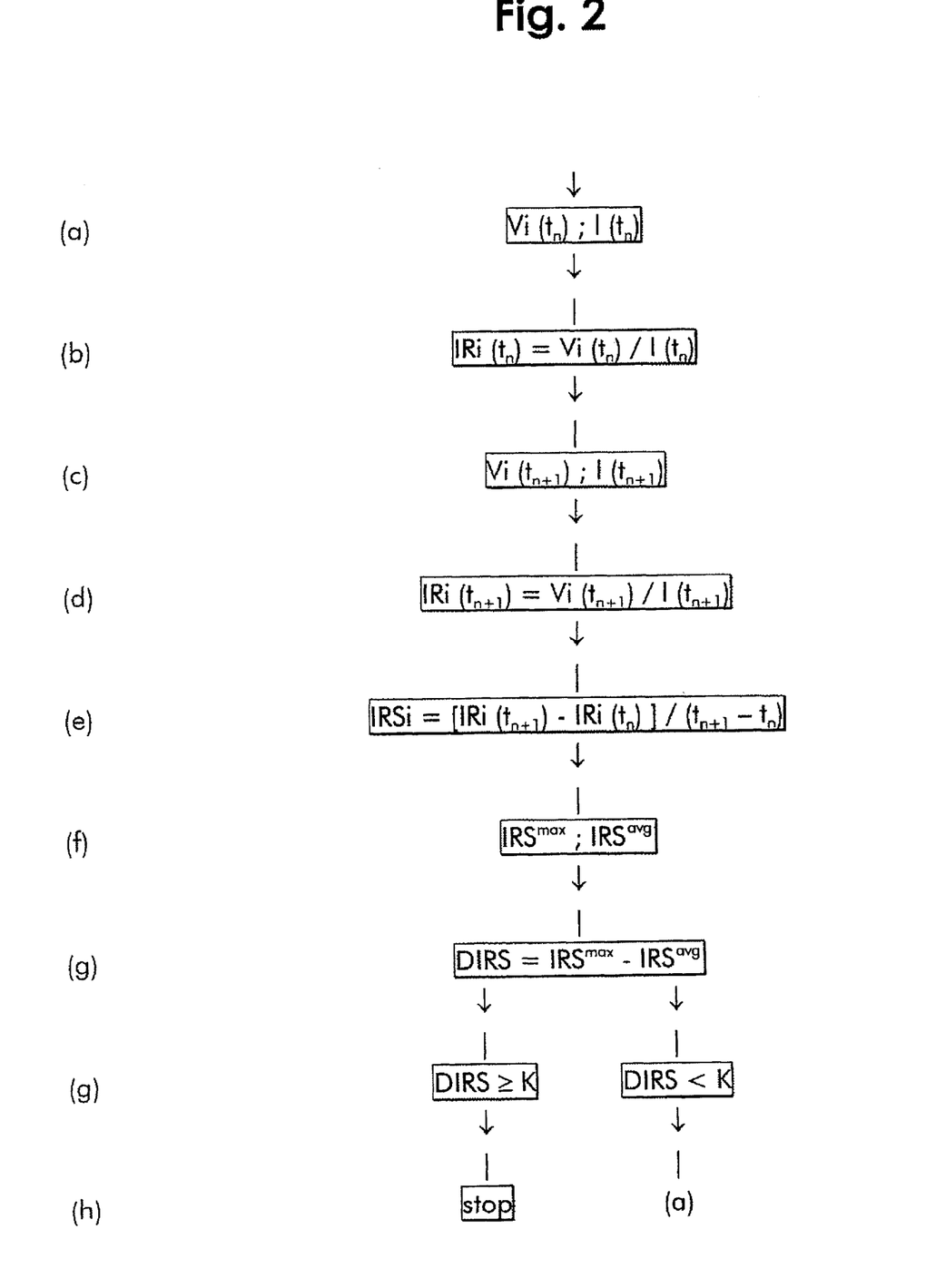
FIG. 2 is analogous to FIG. 1 in the situation where the battery includes more than two modules.

As shown in FIG. 2 in the case of a battery including a greater number of modules, the slopes IRSi of the internal resistances IRi of each of the modules i constituting the battery were calculated between times $t_n$ and $t_{n+1}$: $IRS_1=V_i(t_{n+1})/I(t_{n+1})-V_i(t_n)/I(t_n)$. The maximum value $IRS^{max}$ and the average value $IRS^{avg}$ of the internal resistance slopes of all of the modules constituting the battery were then calculated. The parameter DIRS which determined the end of discharging of the battery was the difference between the maximum internal resistance slope $IRS^{max}$ and the average slope $IRS^{avg}$: $DIRS=IRS^{max}-IRS^{avg}$. The value of the parameter DIRS, corrected for the rate of change of the current I(t), was compared to the criterion K to decide whether to halt discharging or to apply current limiting. The first phase of the discharging terminated when DIRS was greater than or equal to K. It can thus be seen that the first phase of the discharging was terminated by the module having the greatest internal resistance slope.

Figure 5:
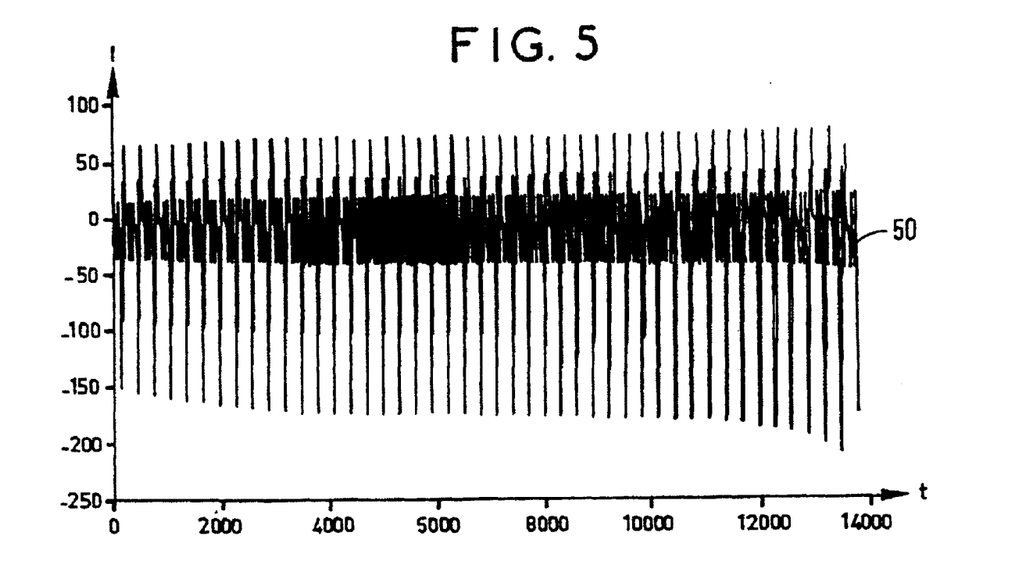
FIG. 5 shows the variation in the discharging current I, expressed in amperes, during a dynamic stress test at constant power without current limitation, as a function of the discharging time t, expressed in seconds.
Figure 6:
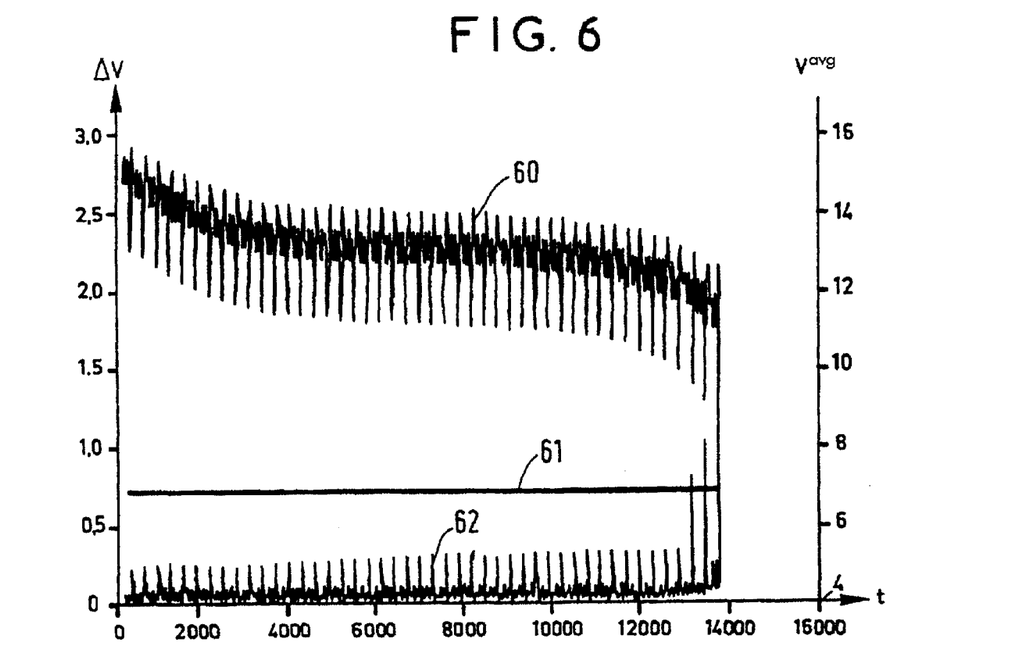
FIG. 6 shows the application of the criterion ΔV to the discharging of a battery during a dynamic stress test in the situation where the modules have little difference in internal resistance; the criterion ΔV is plotted on the lefthand vertical axis, the average voltage $V^{avg}$ in volts is plotted on the righthand vertical axis, and the discharging time t in seconds is plotted on the horizontal axis.
Figure 7:
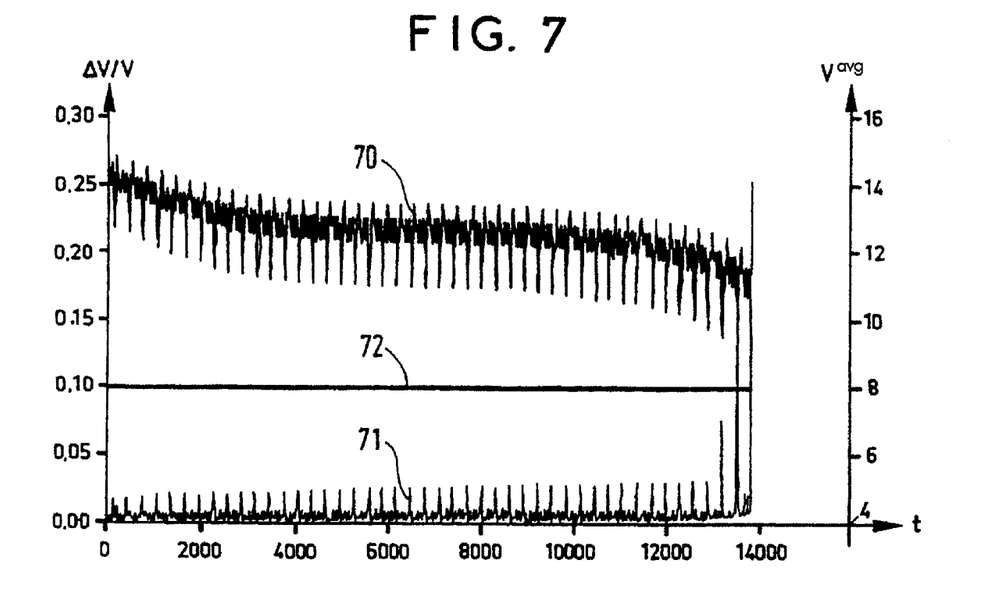
FIG. 7 is analogous to FIG. 6 but relates to application of the criterion ΔV/V.
Figure 8:
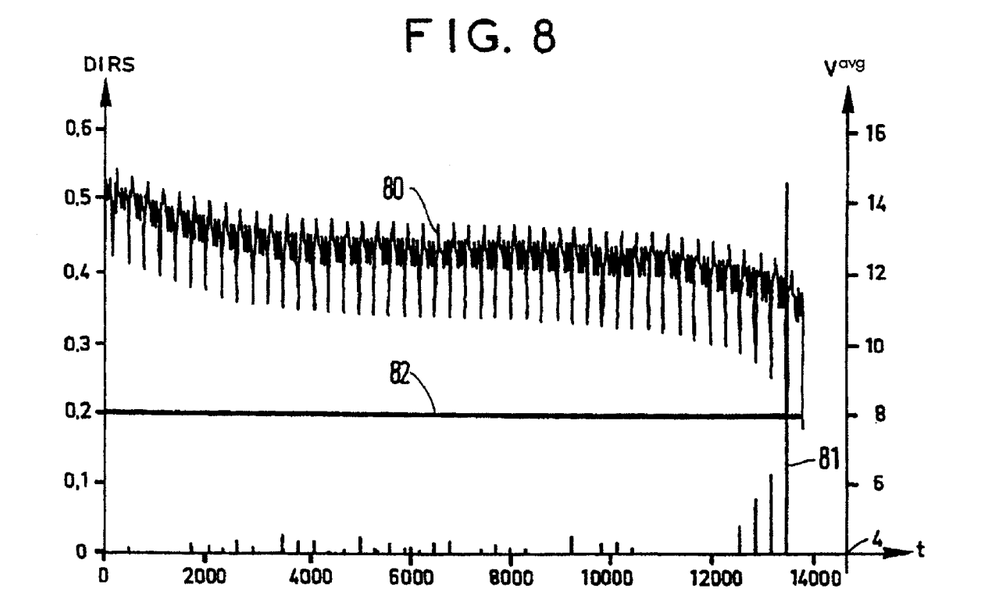
FIG. 8 is analogous to FIG. 6 but relates to application of the criterion DIRS of the method according to the invention.

The curve 50 in FIG. 5 represents the variation of the current I in amperes as a function of the discharging time t in seconds. FIGS. 6, 7 and 8 respectively show the application to the battery A during the DST of the prior art criteria ΔV and ΔV/V and the criterion DIRS of the method according to the invention. The value of the criterion applied is represented in the figures by a horizontal line.

In FIG. 6, the curve 60 represents the variation in the voltage $V^{avg}$ of the modules, which represents the voltage of the battery, and the curve 61 shows the evolution of the criterion ΔV as a function of the discharging time t. The reference value 62 fixed for the criterion ΔV is indicated and was equal to 0.7 V.

In FIG. 7, the curve 70 represents the variation in the voltage $V^{avg}$ of the modules and the curve 71 shows the evolution of the criterion ΔV/V as a function of the discharging time t. The reference value 72 of the criteria ΔV/V is indicated and here was equal to 0.1.

In FIG. 8, the curve 80 represents the variation in the voltage $V^{avg}$ of the modules and the curve 81 shows the evolution of the criterion DIRS as a function of the discharge time t. The reference value K is indicated and here was equal to 0.2 mΩ/s.

Comparing these three figures, representing the situation in which there was only a small difference in internal resistance between the modules, it can be seen that the three methods detected the inversion of a group of storage cells after a discharging time of approximately 13 900 s. When the difference in internal resistance between the modules was small, the three methods were of comparable effectiveness.

EXAMPLE 2

A battery B, similar to the battery A, but having a greater difference in internal resistance between the modules than the battery A, of the order of 10 mΩ, was subjected to a DST under the same conditions as applied in example 1.

Figure 9:
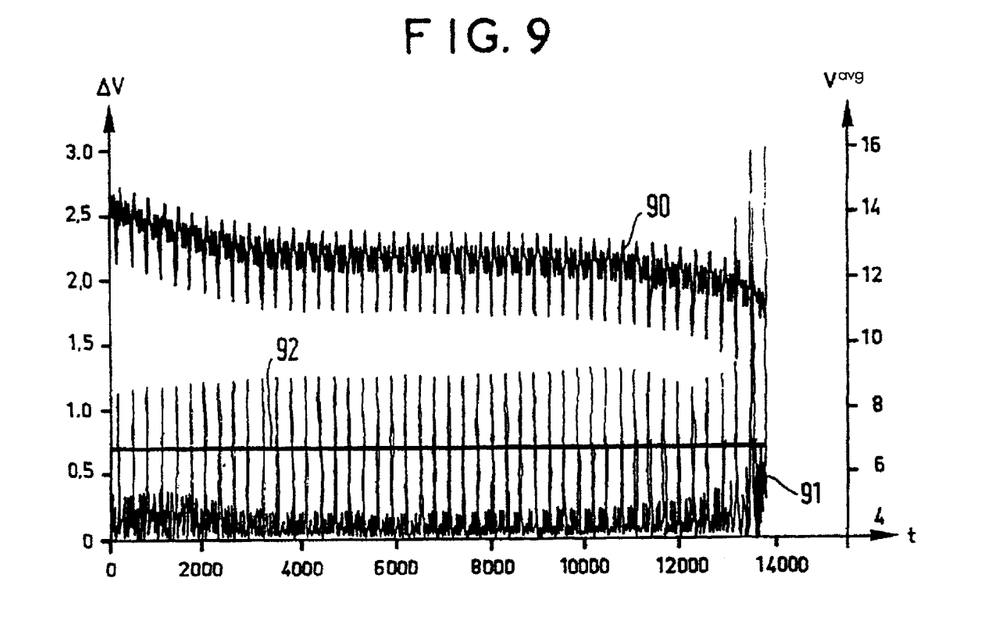
FIG. 9 shows application of the criterion ΔV to the discharging of a battery during a dynamic stress test in the case where the modules have a large difference in internal resistance; the criterion ΔV is plotted on the lefthand vertical axis, the average voltage $V^{avg}$ in volts is plotted on the righthand vertical axis, and the discharging time t in seconds is plotted on the horizontal axis.
Figure 10:
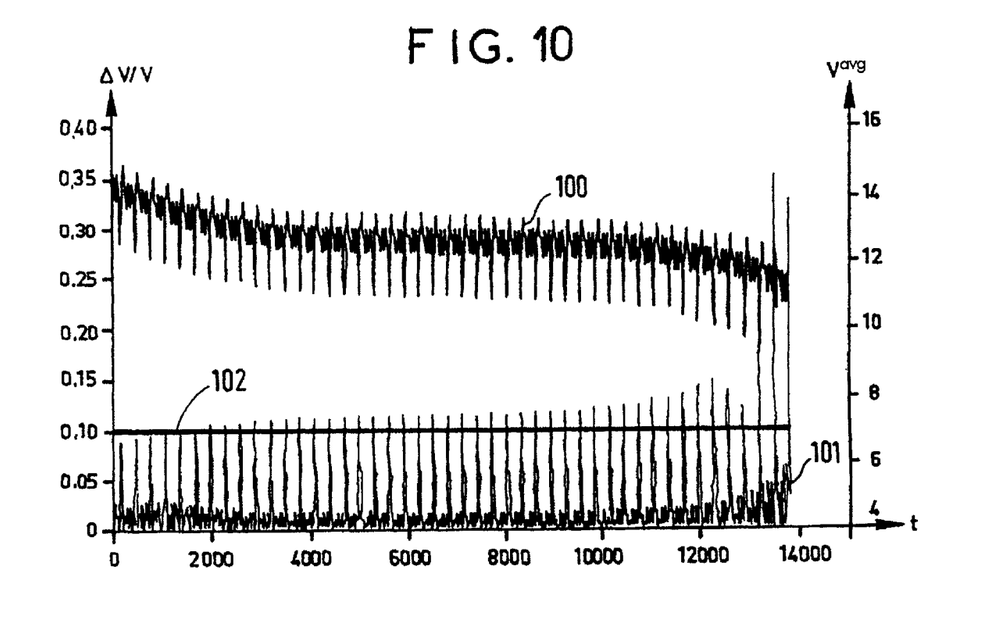
FIG. 10 is analogous to FIG. 9 but relates to application of the criterion ΔV/V.
Figure 11:
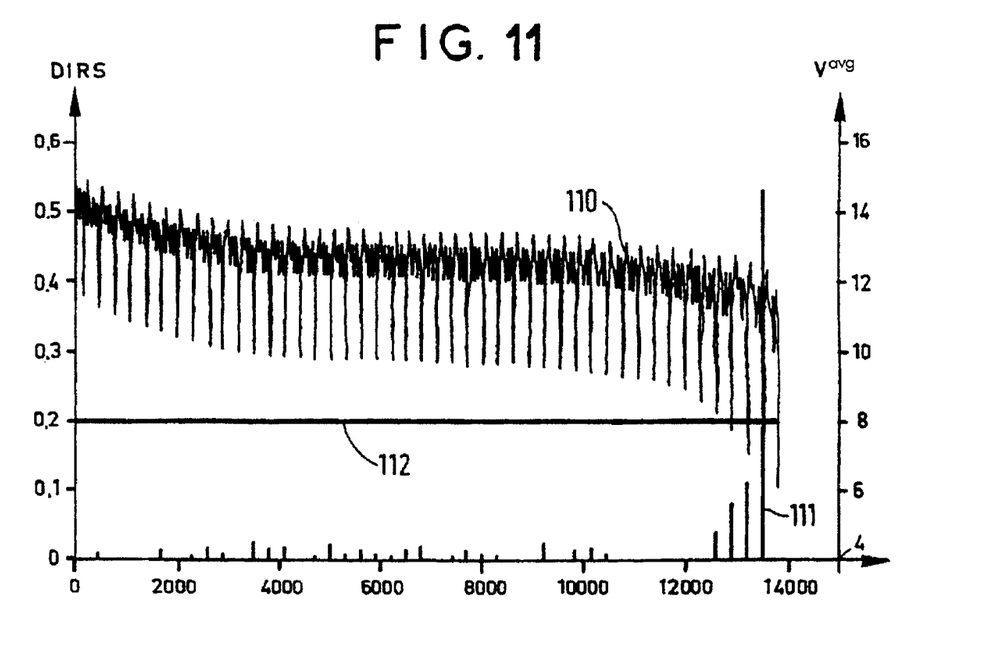
FIG. 11 is analogous to FIG. 9 but relates to application of the DIRS criterion of the method according to the invention.

FIGS. 9, 10 and 11 respectively show the application to the battery B during the DST of the prior art criteria ΔV and ΔV/V and the criterion DIRS of the method according to the invention. The value of the criterion applied is represented in the figure by a horizontal line.

In FIG. 9, the curve 90 represents the variation of the voltage $V^{avg}$ of the modules and the curve 91 shows the evolution of the criterion ΔV as a function of the discharging time t. The reference value 92 of the criterion ΔV is indicated and here was equal to 0.7 V.

In FIG. 10, the curve 100 represents the variation of the voltage $V^{avg}$ of the modules and the curve 101 shows the evolution of the criterion ΔV/V as a function of the discharging time t. The reference value 102 of the criterion ΔV is indicated and here was equal to 0.1.

In FIG. 11, the curve 110 represents the variation of the voltage $V^{avg}$ of the modules and the curve 111 shows the evolution of the criterion DIRS as a function of the discharging time t. The reference value K is indicated and here was equal to 0.2 mΩ/s.

Note that application of the criterion ΔV stopped discharging after approximately 210 s, because of the difference in internal resistance between the modules, whereas applying the criterion ΔV/V increased the time before discharging stopped to 1 400 s. However, applying the method according to the present invention interrupted discharging after 13 500 s, which fully discharged the battery. This shows clearly better control of the end of discharging by the method according to the invention, despite the differences in internal resistance between the modules.

EXAMPLE 3

A battery C was made up of 28 monoblock 12 V–93 Ah modules electrically connected in series, each consisting of 10 nickel/metal hydride storage cells electrically connected in series. The modules had very different internal resistances, and the difference could be as high as 3 mΩ.

Figure 12:
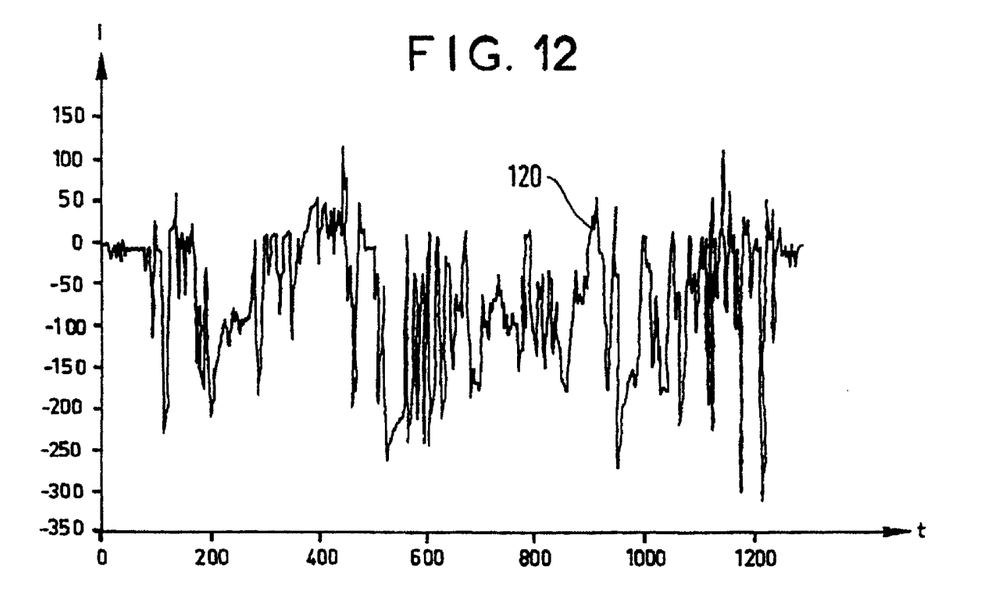
FIG. 12 shows the rate of change of the current during discharging representative of electric vehicle operation.

The battery C was subjected to a DST under the same conditions as in an electrical vehicle, the variations in current being random. The curve 120 in FIG. 12 shows the random variation in the current I with time t during discharging in an electrical vehicle.

The DST conditions were as follows:
charging at Ic/3 until a first module reaches the criterion dT/dt, followed by overcharging from 1 Ah to 6 Ah at a current of 4.5 A, depending on the depth of the preceding discharge, with cooling active at 12° C. throughout the charging, discharging under varying conditions and to a varying depth of discharge, cooling becoming active at 12° C. if the temperature of the modules exceeded 40° C.

Figure 13:
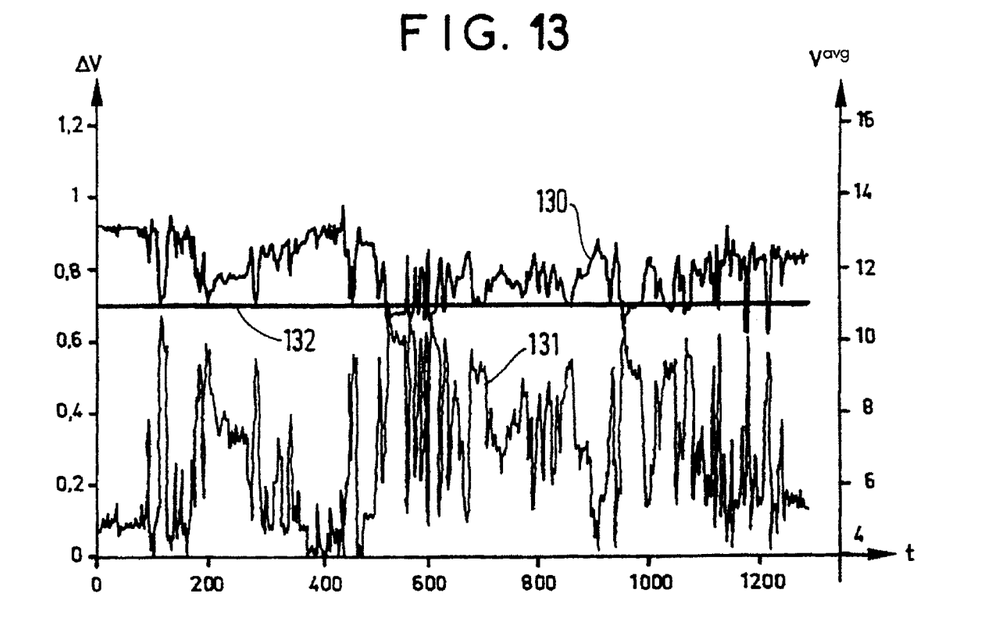
FIG. 13 shows the application of the criterion ΔV to the variable current discharging of a battery representative of electric vehicle operation and in the situation where the modules have a difference in internal resistance; the criterion ΔV is plotted on the lefthand vertical axis, the voltage $V^{avg}$ of the battery in volts is plotted on the righthand vertical axis, and the discharging time t in seconds is plotted on the horizontal axis.
Figure 14:
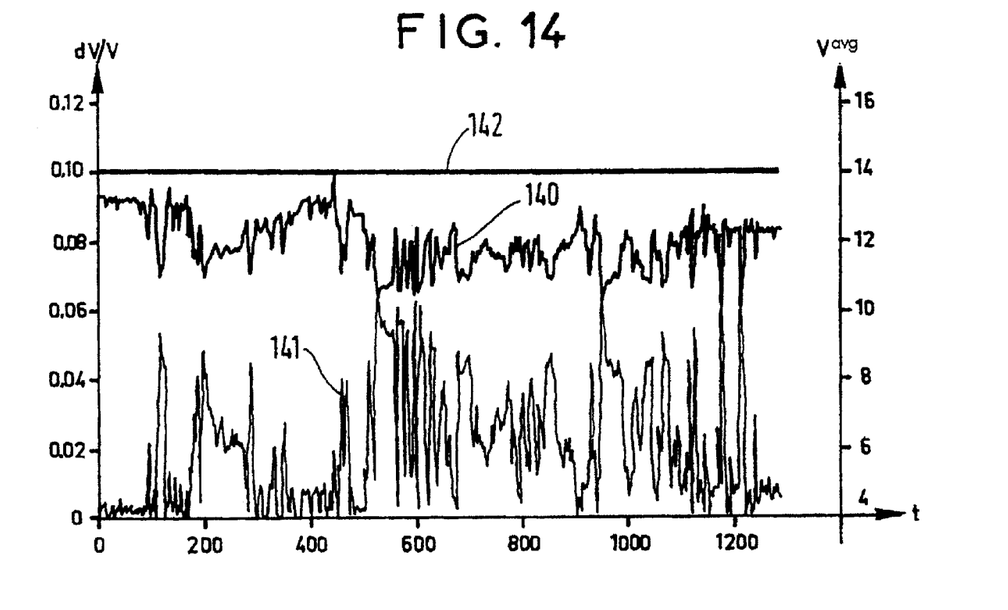
FIG. 14 is analogous to FIG. 13 but relates to application of the criterion ΔV/V.
Figure 15:
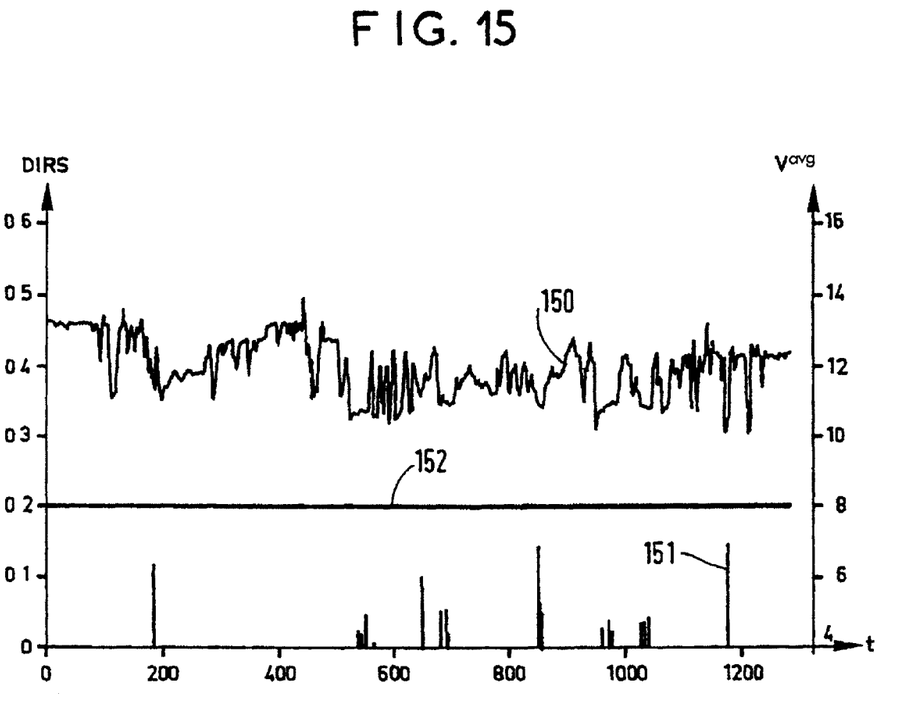
FIG. 15 is analogous to FIG. 13 but relates to application of the criterion DIRS of the method according to the invention.

FIGS. 13, 14 and 15 respectively illustrate the application to the battery C of the criteria ΔV and ΔV/V and of the criterion DIRS of the method according to the invention during a test representative of real-world operation. The value of the criterion applied is represented in the figure by a horizontal line.

In FIG. 13, the curve 130 represents the variation in the voltage $V^{avg}$ of the modules and the curve 131 shows the evolution of the criterion ΔV as a function of the discharge time t. The reference value 132 of the criterion ΔV is indicated and here was equal to 0.7 V.

In FIG. 14, the curve 140 represents the variation in the voltage $V^{avg}$ of the modules and the curve 141 shows the evolution of the ΔV/V as a function of the discharge time t. The reference value 142 of the criterion ΔV/V is indicated and here was equal to 0.1.

In FIG. 1 5, the curve 150 represents the variation in the voltage $V^{avg}$ of the modules and the curve 151 shows the evolution of the criterion DIRS as a function of the discharge time t. The reference value K is indicated and here was equal to 0.2 mΩ/s.

Note that in this case applying the criterion ΔV stopped discharging prematurely after approximately 550 s, because of the difference in internal resistance between the modules. Applying the criterion ΔV/V or the criterion of the method according to the present invention, the discharge could continue without interruption beyond 1 300 s. Under conditions closer to real-world use of the battery, it is clear that applying the criterion ΔV failed to discharge the battery C in a satisfactory manner. The superiority of the method according to the invention under these conditions is obvious.

What is claimed is:

1. A method of controlling the discharging of a battery including a plurality of modules each consisting of at least one secondary storage cell, which method includes the following steps:

(a) a voltage $Vz(t_n)$ of each module z and a discharge current $I(t_n)$ are measured synchronously at time $t_n$, (b) the internal resistance $IRz(t_n)$ of each module z is calculated as follows: $IRz(t_n)=Vz(t_n)/I(t_n)$, (c) a voltage $Vz(t_{n+1})$ of each module z and a discharge current $I(t_{n+1})$ are measured synchronously at time $t_{n+1}$, (d) the internal resistance $IRz(t_{n+1})$ of each module z is calculated as follows: $IRz(t_{n+1})=Vz(t_{n+1})/I(t_{n+1})$, (e) the slope of the variation in the internal resistance $IRSz$ of each module z is calculated between times $t_n$ and $t_{n+1}$ as follows: $IRSz=[IRz(t_{n+1})-IRz(t)]/I(t_n)$, (f) the maximum value $IRS^{max}$ and the average value $IRS^{avg}$ of the slopes of the variation in the internal resistance of all the modules are calculated, (g) a difference DIRS is calculated as follows: $DIRS=IRS^{max}-IRS^{avg}$, (h) the difference DIRS is compared to a criterion K determined experimentally, and (i) the first phase of discharging is stopped when DIRS is greater than or equal to K, following correction of the rate of change $dI/dt$ of the discharging current $I(t)$.

2. The method claimed in claim 1 wherein said discharge current $I(t)$ is at least equal to 100 A.

3. The method claimed in claim 1 wherein said criterion K is a linear function of the rate of change $dI/dt$ of said discharging current $I(t)$.

4. The method claimed in claim 1 wherein said module consists of at least two storage cells electrically connected in series.

5. A method of controlling the discharging of a battery made up of two modules each consisting of at least one secondary storage cell, which method includes the following steps:

(a) a voltage $V_1(tn)$ for the module 1, a voltage $V_2(t_n)$ for the module 2, and a discharge current $I(t_n)$ are measured synchronously at time $t_n$, (b) internal resistances $IR_1(t_n)$ and $IR_2(t_n)$ are calculated as follows: $IR_1(t_n)=V_1i(t_n)/I(t_n)$ and $IR_2(t_n)=V_2(t_n)/I(t_n)$, (c) a voltage $V_1(t_{n+1})$ for the module 1, a voltage $V_2(tn+_1)$ for the module 2, and a discharge current $I(t_{n+1})$ are measured synchronously at time $t_{n+1}$, (d) internal resistances $IR_1(t_{n+1})$ and $IR_2(t_{n+1})$ are calculated as follows: $IR_1(t_{n+1})=V_1i(t_{n+1})/I(t_{n+1})$ and $IR_2(t_{n+1})=V_2(t_{n+1})/I(t_{n+1})$, (e) the slopes of the variation in the internal resistances $IRS_1$ and $IRS_2$ between times $t_n$ and $t_{n+1}$ are calculated as follows: $IRS_1=[IR_1(t_{n+1})-IR_1(t_n)]/(t_{n+1}-t_n)$ and $IRS_2 [IR_2(t_{n+1})-IR_2(t_n)]/(t_{n+1}-t_n)$, (f) a difference DIRS is calculated between the slopes of the internal resistances of the modules 1 and 2 as follows: $DIRS=IRS_1-IRS_2$, (g) the difference DIRS is compared to a criterion K determined experimentally, and (h) the first charging phase is stopped if DIRS is greater than or equal to K, after correcting the rate of charge $dI/dt$ of the discharge current $I(t)$.

\* \* \* \* \*